(12) United States Patent
Hashimoto et al.

(10) Patent No.: US 6,806,176 B2
(45) Date of Patent: Oct. 19, 2004

(54) SEMICONDUCTOR DEVICE AND METHOD OF MANUFACTURING THE SAME, CIRCUIT BOARD AND ELECTRONIC INSTRUMENT

(75) Inventors: Nobuaki Hashimoto, Suwa (JP); Terunao Hanaoka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/623,498

(22) Filed: Jul. 22, 2003

(65) Prior Publication Data

US 2004/0072413 A1 Apr. 15, 2004

Related U.S. Application Data

(63) Continuation of application No. 09/793,493, filed on Feb. 27, 2001, now Pat. No. 6,642,615.

(30) Foreign Application Priority Data

Feb. 28, 2000 (JP) ........................................ 2000-050906

(51) Int. Cl.[7] .............................................. H01L 21/44
(52) U.S. Cl. ...................................................... 438/597
(58) Field of Search ................................ 438/597, 598, 438/602, 605, 607, 618, 652, 928, 128, 584

(56) References Cited

U.S. PATENT DOCUMENTS

| 5,270,258 A | 12/1993 | Yoshida |
| 5,446,309 A | 8/1995 | Adachi et al. |
| 5,698,462 A | 12/1997 | Sasaki |
| 5,891,799 A | 4/1999 | Tsui |
| 5,945,741 A | 8/1999 | Ohsawa et al. |

FOREIGN PATENT DOCUMENTS

| JP | 58-43354 A | 3/1983 |
| JP | 4-76946 A | 3/1992 |
| JP | 5-63137 A | 3/1993 |
| JP | 8-264712 A | 10/1996 |

*Primary Examiner*—Van Thu Nguyen
*Assistant Examiner*—Beth E. Owens
(74) *Attorney, Agent, or Firm*—Oliff & Berridge, PLC

(57) ABSTRACT

A method of manufacturing a semiconductor device includes forming a bump projecting from a first surface of a semiconductor chip, and forming a conductive layer so that part of the conductive layer is exposed at a position depressed from a second surface of the semiconductor chip opposite to the first surface, wherein the exposed part of the conductive layer and the bump become electrical connecting sections.

1 Claim, 15 Drawing Sheets

SEMICONDUCTOR DEVICE AND METHOD OF MANUFACTURING THE SAME, CIRCUIT BOARD AND ELECTRONIC INSTRUMENT

PRIOR APPLICATION

This is a Continuation Application of prior application Ser. No. 09/793,493, filed Feb. 27, 2001 now U.S. Pat. No. 6,642,615, issued Nov. 4, 2003.

BACKGROUND OF THE INVENTION

1. Field of the Invention

The present invention relates to a semiconductor device and method of manufacturing the same, a circuit board and an electronic instrument.

2. Description of Related Art

Semiconductor devices in which a plurality of semiconductor chips are stacked have come to be developed lately. Because many of them have been what electrodes of the semiconductor chips are electrically connected by bonding wires or leads, their miniaturization has been limited.

Still more, there has been developed a technology of making electrical connection between upper and lower semiconductor chips by forming through holes in the semiconductor chips, filling them with solder, and forming bumps. However, the thinning of the semiconductor device has been also restricted because gaps corresponding to the height of these bumps are formed between the stacked semiconductor chips.

SUMMARY OF THE INVENTION

The present invention has been devised to solve the above-mentioned problems and its object is to provide a semiconductor device which can be miniaturized and thinned and a method of manufacturing such a semiconductor device, a circuit board and an electronic instrument.

A method of manufacturing a semiconductor device of the present invention comprises the steps of:

forming a conductive layer on a surface of a semiconductor element on which is provided an electrode and electrically connecting the conductive layer to the electrode;

forming a first electrical connecting section on the conductive layer while avoiding the electrode; and forming a hole in the semiconductor element so that part of a surface of the conductive layer on the side of the semiconductor element is exposed as a second electrical connecting section.

A method of manufacturing a semiconductor device of the present invention comprises the steps of:

forming a first conductive layer on a surface of a semiconductor element on which is provided an electrode and electrically connecting the first conductive layer to the electrode;

forming a first electrical connecting section on the first conductive layer;

forming a hole in the semiconductor element so that part of a surface of the electrode on the side of the semiconductor element is exposed; and forming a second conductive layer as a second electrical connecting section within the hole to be electrically connected to the electrode.

A semiconductor device of the present invention comprises:

a semiconductor element;

a conductive layer formed on a surface of the semiconductor element on which is formed an electrode which is electrically connected to the conductive layer; and a first electrical connecting section formed on the conductive layer while avoiding the electrode;

wherein a hole is formed in the semiconductor element so that part of a surface of the conductive layer on the side of the semiconductor element is exposed as a second electrical connecting section.

A semiconductor device of the present invention comprises:

a semiconductor element on which an electrode is formed, wherein a hole is formed in the semiconductor element so that a part of the electrode is exposed;

a first conductive layer formed on a surface of the semiconductor element on which is formed the electrode which is electrically connected to the first conductive layer;

a first electrical connecting section formed on the first conductive layer; and a second conductive layer formed within the hole as a second electrical connecting section.

DETAILED DESCRIPTION OF THE EMBODIMENTS

Figure 1A:
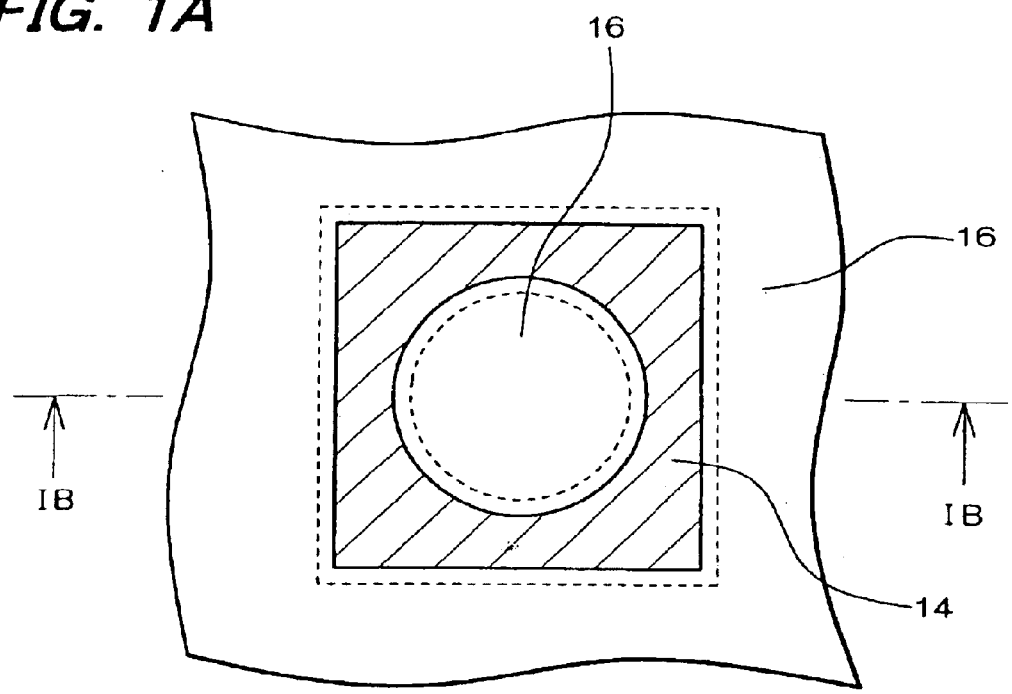
FIGS. 1A and 1B show a method of manufacturing a semiconductor device according to a first embodiment of the present invention.

Embodiments of the present invention will be described below.

(1) A method of manufacturing a semiconductor device of the present invention comprises the steps of:

forming a conductive layer on a surface of a semiconductor element on which is provided an electrode and electrically connecting the conductive layer to the electrode;

forming a first electrical connecting section on the conductive layer while avoiding the electrode; and forming a hole in the semiconductor element so that part of a surface of the conductive layer on the side of the semiconductor element is exposed as a second electrical connecting section.

According to the present invention, the second electrical connecting section is formed within the hole of the semiconductor element. Since electrical connecting sections of other components are required to enter the inside of the semiconductor element for electrical connection, gaps between the semiconductor element and other components are narrowed and the semiconductor device can be miniaturized and thinned.

(2) In the method of manufacturing a semiconductor device, the hole may be formed so that at least part of the second electrical connecting section and part of the first electrical connecting section overlap each other as viewed from a direction perpendicular to the semiconductor element.

(3) In the method of manufacturing a semiconductor device, the electrode may be formed into a ring shape; the conductive layer may be formed so as to cover the center opening of the electrode; and the hole may be formed in the semiconductor element within a region corresponding to the center opening of the electrode.

(4) A method of manufacturing a semiconductor device of the present invention comprises the steps of:

forming a first conductive layer on a surface of a semiconductor element on which is provided an electrode and electrically connecting the first conductive layer to the electrode;

forming a first electrical connecting section on the first conductive layer;

forming a hole in the semiconductor element so that part of a surface of the electrode on the side of the semiconductor element is exposed; and forming a second conductive layer as a second electrical connecting section within the hole to be electrically connected to the electrode.

According to the present invention, the second electrical connecting section is formed within the hole of the semiconductor element. Since electrical connecting sections of other components are required to enter the inside of the semiconductor element for electrical connection, gaps between the semiconductor element and other components are narrowed and the semiconductor device can be miniaturized and thinned.

(5) In the method of manufacturing a semiconductor device, the hole may be formed so that the area of the second electrical connecting section includes the area of the first electrical connecting section as viewed from a direction perpendicular to the semiconductor element.

(6) In the method of manufacturing a semiconductor device, the semiconductor element may be ground from the surface opposite to the surface on which the electrode is formed, after the formation of the first and second electrical connecting sections.

(7) In the method of manufacturing a semiconductor device, a bump may be formed as the first electrical connecting section.

(8) In the method of manufacturing a semiconductor device, a small hole having a diameter which is shorter than the diameter of the hole may be formed at first, and the hole may be formed by enlarging the small hole.

This makes it possible to form the small hole by energy less than that necessary for creating the hole, and the formation of the small hole can reduce the energy necessary for creating the hole.

(9) In the method of manufacturing a semiconductor device, the small hole may be formed by laser beams and enlarged by wet etching.

This makes it possible to form a hole easily. Even if the inner wall surface of the small hole formed by the laser beam is rough, a hole having a smooth inner wall surface can be formed since the small hole is enlarged by wet etching.

(10) In the method of manufacturing a semiconductor device, the semiconductor element may be a semiconductor chip.

(11) In the method of manufacturing a semiconductor device, the semiconductor element may be part of a semiconductor wafer and the above-mentioned steps may be carried out on the semiconductor wafer.

(12) According to the present invention, there is provided a method of manufacturing a stacked-type of semiconductor device in which a plurality of semiconductor devices manufactured by the above-described method are stacked, the method comprising a step of:

electrically connecting the first electrical connecting section of a first semiconductor device among the plurality of semiconductor devices to the second electrical connecting section of a second semiconductor device which is stacked on the first semiconductor device.

A three-dimensional mount is applied to this manufacturing method of the semiconductor device.

(13) In the method of manufacturing a stacked-type of semiconductor device, the hole of the second semiconductor device may be formed to be larger than the first electrical connecting section of the first semiconductor device.

This makes it possible to prevent a short circuit between the first electrical connecting section of the first semiconductor device and the internal circuit of the second semiconductor device.

(14) A semiconductor device of the present invention comprises:

a semiconductor element;

a conductive layer formed on a surface of the semiconductor element on which is formed an electrode which is electrically connected to the conductive layer; and a first electrical connecting section formed on the conductive layer while avoiding the electrode;

wherein a hole is formed in the semiconductor element so that part of a surface of the conductive layer on the side of the semiconductor element is exposed as a second electrical connecting section.

According to the present invention, the second electrical connecting section is formed within the hole of the semiconductor element. Since electrical connecting sections of other components are required to enter the inside of the semiconductor element for electrical connection, gaps between the semiconductor element and other components are narrowed and the semiconductor device can be miniaturized and thinned.

(15) In the semiconductor device, the hole may be formed so that at least part of the second electrical connecting section and part of the first electrical connecting section overlap each other as viewed from a direction perpendicular to the semiconductor element.

(16) In the semiconductor device, the electrode may be formed into a ring shape; the conductive layer may be formed so as to cover the center opening of the electrode; and the hole may be formed in the semiconductor element within a region corresponding to the center opening of the electrode.

(17) A semiconductor device of the present invention comprises:

a semiconductor element on which an electrode is formed, wherein a hole is formed in the semiconductor element so that a part of the electrode is exposed;

a first conductive layer formed on a surface of the semiconductor element on which is formed the electrode which is electrically connected to the first conductive layer;

a first electrical connecting section formed on the first conductive layer; and a second conductive layer formed within the hole as a second electrical connecting section.

According to the present invention, the second electrical connecting section is formed within the hole of the semiconductor element. Since electrical connecting sections of other components are required to enter the inside of the semiconductor element for electrical connection, gaps between the semiconductor element and other components are narrowed and the semiconductor device can be miniaturized and thinned.

(18) In the semiconductor device, the hole may be formed so that the area of the second electrical connecting section includes the area of the first electrical connecting section as viewed from a direction perpendicular to the semiconductor element.

(19) The semiconductor device of the present invention is manufactured by the method described above.

(20) In the semiconductor device, the semiconductor element may be a semiconductor chip.

(21) The semiconductor device may further comprise a semiconductor wafer, wherein the semiconductor element is part of the semiconductor wafer.

(22) According to the present invention, there is provided a stacked-type of semiconductor device formed by stacking a plurality of semiconductor devices described above, wherein the first electrical connecting section of a first semiconductor device among the plurality of semiconductor devices is electrically connected to the second electrical connecting section of a second semiconductor device which is adjacent to the first semiconductor device.

(23) In the stacked-type of semiconductor device, the hole of the second semiconductor device may be formed to be larger than the first electrical connecting section of the first semiconductor device.

This makes it possible to prevent a short circuit between the first electrical connecting section of the first semiconductor device and the internal circuit of the second semiconductor device.

(24) In the semiconductor device, the first electrical connecting section may be a bump.

(25) According to the present invention, there is provided a circuit board on which the above-described semiconductor device is mounted.

(26) An electronic instrument of the present invention has the above-described semiconductor device.

Embodiments of the present invention will be described below with reference to the drawings.

First Embodiment

Figure 1B:
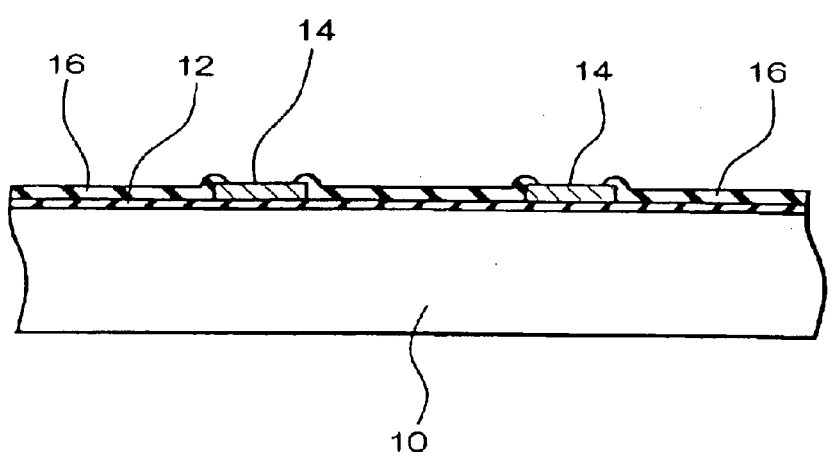

FIGS. 1A and 1B show a part of a semiconductor chip 10 used in the present embodiment, wherein FIG. 1A is a section view of the semiconductor chip 10 and FIG. 1B is a section view along a line IB—IB in FIG. 1A. While the shape of the semiconductor chip 10 is rectangular parallelepiped (including cube) in general, its shape is not limited and may be spherical.

The semiconductor chip 10 has an insulating film (interlayer film) 12 on the surface on which integrated circuits comprising transistors, memory devices and others not shown are formed. The insulating film 12 is made often from silicon oxide film ($SiO_2$) and silicon nitride (SiN) which are the basic materials of the semiconductor chip 10.

An electrode (pad) 14 is formed on the insulating film 12 and is connected electrically with the integrated circuit at the part not shown. The electrode 14 is made often from aluminum. The electrodes 14 are arrayed along at least one side (two or four sides in many cases) of surface of the semiconductor chip 10. There are also cases when the electrodes 14 are arrayed at the edge of the surface of the semiconductor chip 10 and at the center thereof. The electrode 14 may be formed of a plurality of layers because it is constructed corresponding to the manufacturing process of the integrated circuit.

The electrode 14 in a plan view is ring-shaped as shown by a broken line in FIG. 1A. More specifically, an opening, e.g., a circular opening, is formed at the center of the rectangular electrode 14.

A passivation film 16 is formed on the insulating film 12. The passivation film 16 covers the edge of the outline of the electrode 14 as well as the edge of the opening thereof. It is noted that the passivation film 16 is formed also within the opening. As a result, the electrode 14 is exposed at the hatched part. It is noted that the passivation film 16 may be formed of $SiO_2$, SiN, polyimide resin or the like for example.

Manufacturing Method of Semiconductor Device

The semiconductor device will be manufactured by the following method by using the semiconductor chip 10 described above in the present embodiment.

Figure 2A:
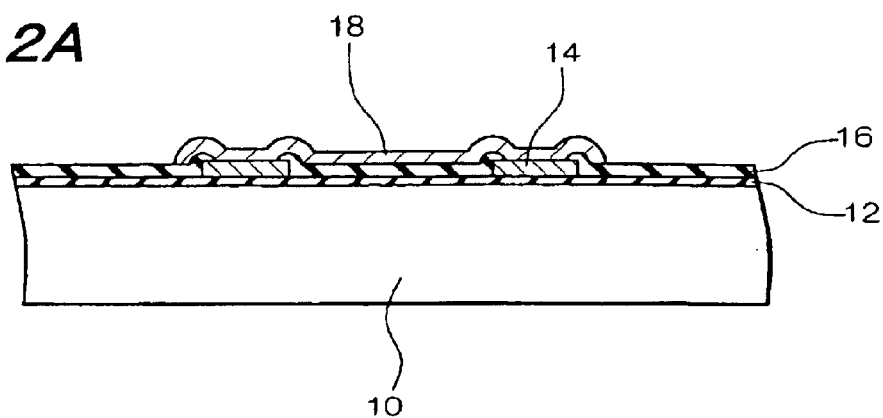
FIGS. 2A to 2C show the method of manufacturing a semiconductor device according to the first embodiment of the present invention.

A conductive layer 18 covering the electrode 14 is formed as shown in FIG. 2A. It is desirable to form the conductive layer 18 so as to have strength which allows it to be hanged across the inside of a hole (see FIG. 4B) as described later (at thickness of 1 μm or more for example). It is preferable to form the conductive layer 18 so that it extrudes from the edge of the outline of the electrode 14. The conductive layer 18 is formed so that it also covers the opening of the ring-shaped electrode 14 (see FIG. 1A). The conductive layer 18 may be formed by means of electroless plating.

For example, the conductive layer 18 maybe formed of nickel by substituting the surface of aluminum to zinc by implementing a zincate process on the electrode 14, by soaking the electrode 14 into electroless nickel plating solution after that and by depositing nickel on the electrode 14 through a zinc and nickel substitution reaction. Nickel grows also on the opening of the ring-shaped electrode 14.

Or, the electrode 14 may be soaked into a palladium solution which selectively adsorb on aluminum and by soaking into the electroless nickel plating solution thereafter to deposit nickel around palladium as the nucleus.

A gold layer is formed further on the nickel layer by soaking into the electroless gold plating solution. The formation of the gold layer makes the electrical connection with a bump formed thereon more reliable. Because nickel may be deposited on the electrode 14 in a short time as compared to gold in general, it is preferable to form the first layer (underlayer) by nickel and to form the second layer (upper layer or surface layer) by gold as compared to forming all of the conductive layer 18 by gold.

The back and side of the semiconductor chip 10 may be covered by a protecting film, e.g., resist, beforehand in soaking the semiconductor chip 10 into the electroless plating solution. It is also preferable to shut off light during when the semiconductor chip 10 is soaked into the electroless plating solution. It enables to prevent the thickness of the plating from fluctuating due to the change of potential between the electrodes in the solution which occurs by soaking the semiconductor chip 10 into the solution. It applies to any of the following electroless plating.

Figure 2B:
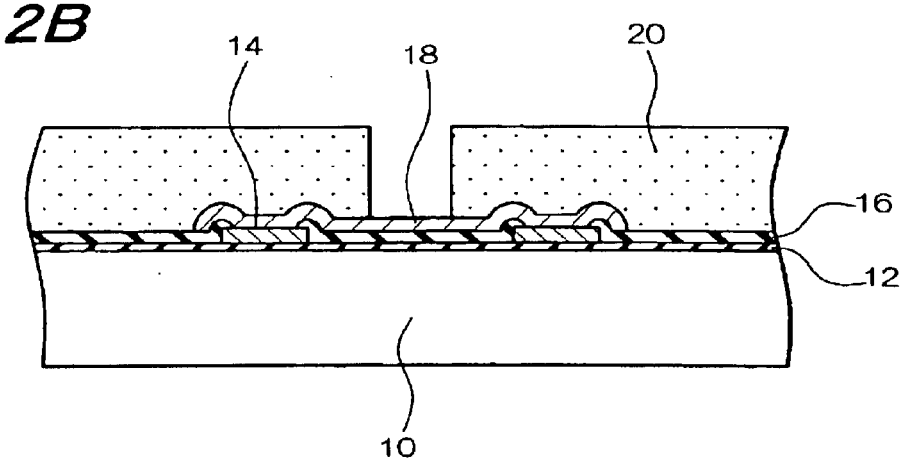

A resist 20 is formed on the surface of the semiconductor chip 10 on which the electrode 14 is formed and is patterned as shown in FIG. 2B.

Spin coating, dipping, splay coating and others may be used as a method of forming the resist 20. The resist 20 is formed so as to also cover the electrode 14. The resist 20 covers a part which is not etched by an etching step described later. The resist 20 may be any of photoresist, electron beam resist and X-ray resist or may be either a positive or negative type resist. The resist 20 used in the present embodiment is the positive type photoresist. The resist 20 is pre-baked to fly solvent so that it does not adhere to the other members after coating.

The resist 20 may be patterned by irradiating energy by disposing a mask not shown in the resist 20. The energy is different depending on the property of the resist 20 and may be either one of light, electron beam and X-ray. The shape of the mask is determined by the patterning shape and is inverted depending on whether the resist 20 is the positive type or the negative type. After that, the resist 20 is developed and is post-baked.

An opening is formed in the patterned resist 20 at the region where a bump 22 is formed. The bump 22 is formed at the inside of the outline of the electrode 14. According to the present embodiment, the bump 22 is formed at the inside of the center opening of the electrode 14. The bump 22 is also formed at the position distant from the edge of the center opening.

Figure 2C:
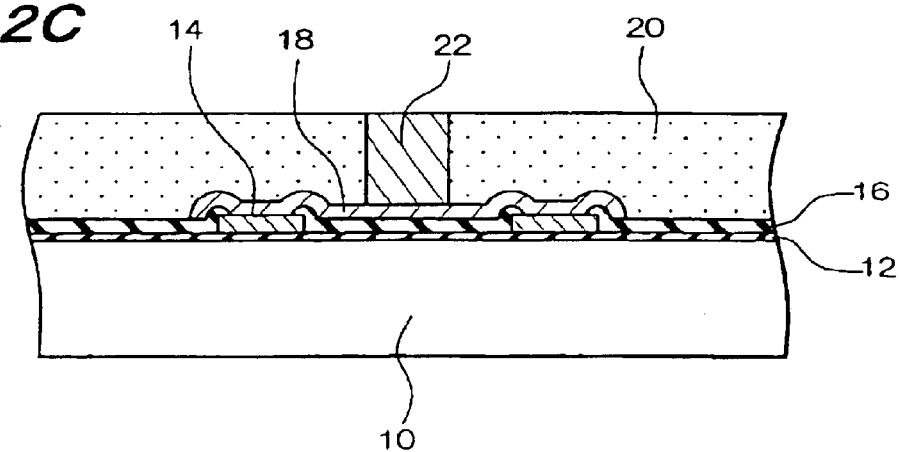
Figure 3A:
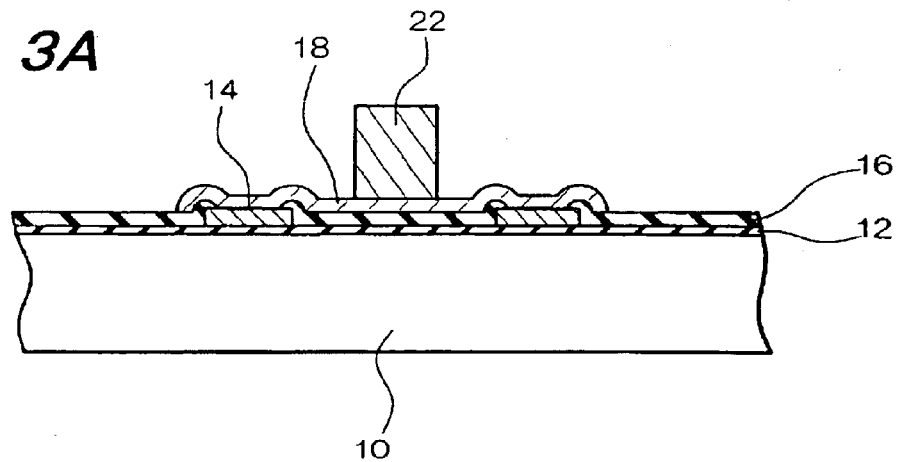
FIGS. 3A to 3C show the method of manufacturing a semiconductor device according to the first embodiment of the present invention.

The bump 22 is formed by forming a metallic layer by electroless plating in the opening of the resist 20 as shown in FIG. 2C. Then, the resist 20 is removed as shown in FIG. 3A. The bump 22 is a first electrical connecting section protruding from the first surface, e.g., the surface on which the electrode 14 is formed, of the semiconductor chip 10.

Electroless nickel plating solution is used in creating the bump 22 by nickel. Although metal grows isotropically by the electroless plating, the metallic layer may be formed in the direction of height and the growth in the horizontal (width) direction can be suppressed by causing the metal to grow within the opening of the resist 20. Accordingly, it is possible to form the bump 22 whose diameter is small.

It is noted that the bump 22 may be formed of either one of nickel, gold and a mixture of nickel and gold and may be formed of a single layer or of a plural layer. For example, a second layer made of gold may be provided on the first layer made of nickel. The gold layer may be formed on the nickel layer by soaking the nickel layer in electroless gold plating solution to form the gold layer on the surface of the nickel layer. The electrical connection with the other parts may be made more reliable by forming the gold layer. It is preferable to form the first layer (under layer) by nickel and to form the second layer (upper or surfacial layer) by gold rather than forming all of the bump 22 by gold because nickel may be deposited in shorter time as compared to gold.

Figure 3B:
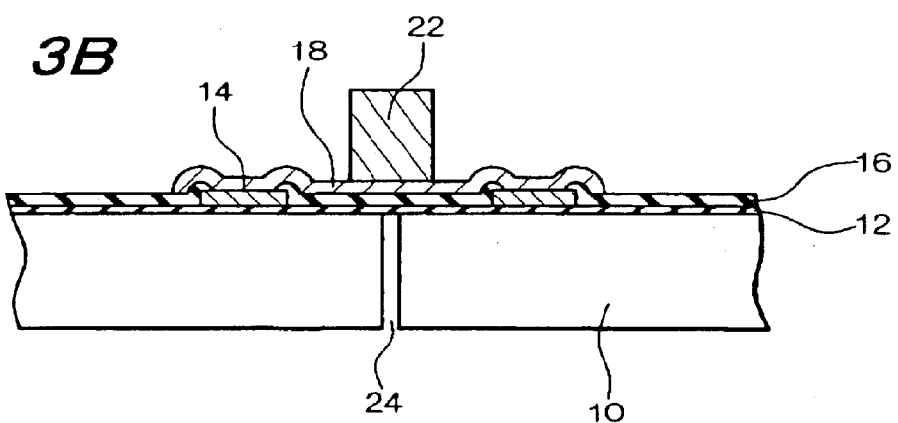

A small hole 24 (about 20 $\mu$m of diameter for example) is formed in the semiconductor chip 10 as shown in FIG. 3B. The small hole 24 is formed from the second surface of the semiconductor chip 10 (the surface opposite from the first surface on which the electrode 14 is formed). It is preferable to create the small hole 24 so that it reaches at least to the insulating film 12. It may penetrate through the insulating film 12 or the passivation film 16. In this case, the small hole 24 may be formed from the first surface of the semiconductor chip 10. Although it is preferable to create the small hole 24 so that it does not penetrate, it will not impede the application of the present invention even if it is a through hole. Laser, e.g., YAG laser and $CO_2$ laser, may be used in creating the small hole 24. The small hole 24 is formed so as to have a diameter smaller than a hole described later. It is preferable to create the small hole 24 within the area of the bump 22. Thereby, it is possible to stop the creation of the small hole 24 within the bump 22 and to avoid the small hole 24 from becoming a through hole even it is difficult to control the depth of the small hole 24.

Figure 3C:
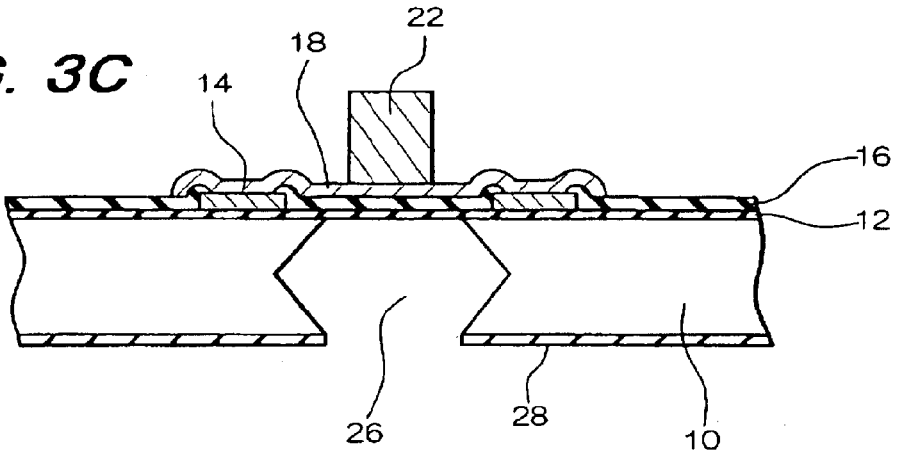

Next, a hole 26 is formed in the semiconductor chip 10, as shown in FIG. 3C. The hole 26 is formed by enlarging the small hole 24 described above. For example, the inner wall surface of the small hole 24 maybe etched by applying wet-etching. A solution (buffered hydrofluoric acid) in which potassium hydroxide (KOH), hydrofluoric acid and ammonium fluoride are mixed may be used for example as the etching solution. Although the etching solution erodes the electrode 14 formed of aluminum, the electrode 14 is coated by the insulating film 12, the passivation film 16 and the conductive layer 18. It is noted that it is preferable to create the conductive layer 18 by a material, e.g., nickel and gold, which is hardly eroded by the etching solution.

It is noted that a film 28 which is not etched is formed in advance to stop the enlargement of the opening of the hole 26. The film 28 may be an oxide film, e.g., silicon oxide film, and may be formed by means of CVD. It is noted that the film 28 may be formed before forming the small hole 24.

The hole 26 may be formed so as to have an opening edge and an intermediate section whose diameter is larger, e.g., 40 $\mu$m to 50 $\mu$m, than that of the opening edge. For instance, the hole 26 may be formed so that the diameter becomes large to the center of the thickness direction from the surface and back of the semiconductor chip 10. More specifically, the hole 26 is composed of an inversely tapered and inclined surface from the second surface (on which the opening edge is formed) of the semiconductor chip 10 to the center of the thickness direction and of an inversely tapered and inclined surface from the first surface (on which the electrode 14 is formed) of the semiconductor chip 10 to the center of the thickness direction. The hole 26 becomes such shape when wet-etching is applied.

It is noted that although the wet-etching has been applied in the above-mentioned case, dry-etching may be applied or the both may be combined. The dry-etching may be reactive ion etching (RIE). Further, although the hole 26 has been formed by creating the small hole 24 in the above-mentioned case, the hole 26 may be formed directly without creating the small hole 24. It is preferable to apply anisotropic etching in such a case.

Figure 4A:
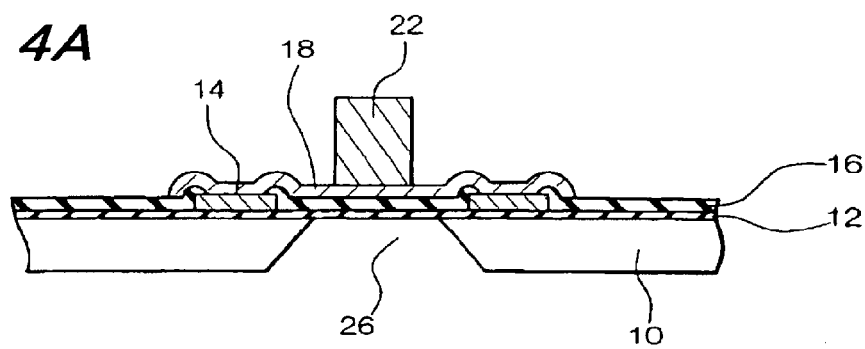
FIGS. 4A to 4C show the method of manufacturing a semiconductor device according to the first embodiment of the present invention.

Then, the semiconductor chip 10 is ground as shown in FIG. 4A. More specifically, the second surface (the surface on the opposite side from the electrode 14) of the semiconductor chip 10 is ground to thin the thickness (back-lap). When the hole 26 has the shape described above, the opening of the hole 26 may be widened after the grinding as shown in FIG. 4A by grinding the semiconductor chip 10 to the position where the diameter of the hole 26 is the largest.

The hole 26 exposes at least a part of the back of the conductive layer 18 where the bump 22 is provided. It is preferable to create the hole 26 so that it is larger than the bump 22. The hole 26 is also formed so that it surrounds the whole bump 22. Although the hole 26 shown in FIG. 4A is a tapered hole, it is not essential for the invention and the hole 26 may be formed by a wall vertical in the depth direction.

Figure 4B:
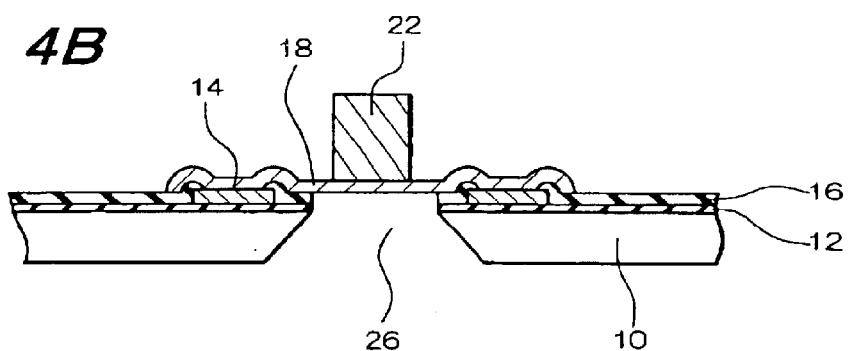

Then, the conductive layer 18 is exposed at the inside of the hole 26 as shown in FIG. 4B. For instance, the insulating film 12 and the passivation film 16 are removed at the inside of the hole 26. Dry-etching may be applied for the removal. Thus, the part of the conductive layer 18 exposed through the hole 26 becomes a second electrical connecting section. The electrical connecting section is formed at the position depressed from the second surface (the surface on the opposite side from the electrode 14).

When an electrode of the semiconductor chip laminated on the bump 22 in the later step is large, the bump 22 may be formed larger because the hole can be enlarged. The bump 22 may be formed through a maskless process by stopping the photolithography using resist shown in FIG. 2B.

Semiconductor Device

FIG. 4B shows a semiconductor device manufactured through the steps described above. This semiconductor device comprises the semiconductor chip 10 having the plurality of electrodes 14 and the bump 22 (first electrical connecting section) protruding from the first surface (on which the electrode 14 is formed for example) of the semiconductor chip 10. The conductive layer 18 is formed on the first surface and the bump 22 is connected to each electrode 14 via the conductive layer 18. The part of the conductive layer 18 is exposed through the hole 26 formed in the second surface (the surface opposite from the first surface) of the semiconductor chip 10. The exposed part of the conductive layer 18 is the second electrical connecting section. The second electrical connecting section (exposed part of the conductive layer 18) is formed at the position depressed from the second surface.

The hole 26 or the second electrical connecting section (exposed part of the conductive layer 18) is formed to be larger than the part of the conductive layer 18 where the bump 22 is provided. The conductive layer 18 floats at the inside of the hole 26 and the bump 22 is supported (only) by the conductive layer 18. Accordingly, the conductive layer 18 relaxes stress applied to the bump 22.

Figure 4C:
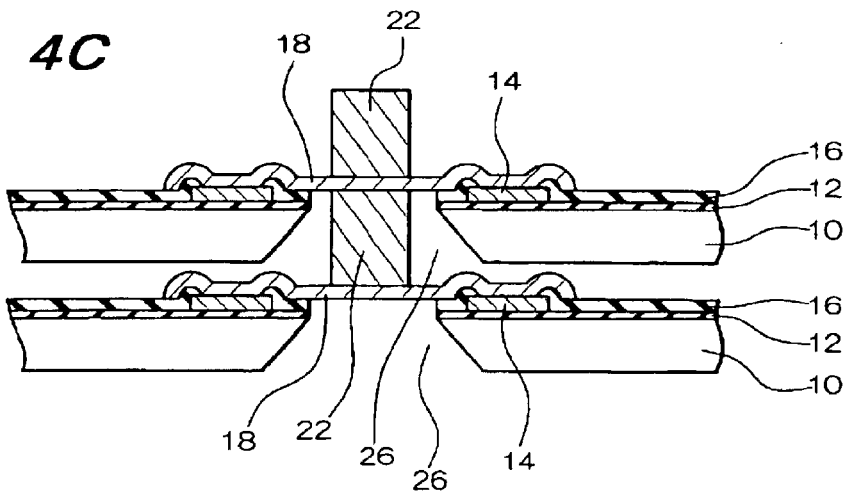

The other structure is the same as described in the above-mentioned manufacturing method. According to the present embodiment, the second electrical connecting section (exposed part of the conductive layer 18) is formed at the dented position. Accordingly, when a plurality of semiconductor devices are stacked as shown in FIG. 4C, the terminals such as the bump 22 (the first electrical connecting section) enter from the surface (second surface) of the semiconductor chip 10. Thus, the three-dimensionally mounted semiconductor devices (stacked-type of semiconductor devices) may be miniaturized and thinned.

It is noted that metal junction of Ni—Ni, Au—Au, Au—Sn and solder may be applied for junction of the bump 22 (the first electrical connecting section) and the exposed part of the conductive layer 18 (the second electrical connecting section). The both are junctioned by applying only ultrasonic vibration or by applying ultrasonic vibration and heat. When they are junctioned, the metal junction is achieved as the materials of the both diffuse.

It is preferable to electrically insulate the inner surface of the hole 26 from the bump 22 because the hole 26 is formed in the semiconductor chip 10. Although an insulating film may be formed at the inner surface of the hole 26 to that end, the hole 26 may be formed to be larger than the bump 22 connected to the exposed part of the conductive layer 18. Thereby, the bump 22 is disposed at the position separated from the bump 22. No highly reliable (thick) insulating film needs to be formed at the inner surface of the hole 26 because the hole 26 is separated from the bump 22. However, although no thick insulating film is formed, the insulating film is often formed by an oxide film or the like at the inner surface of the hole 26.

The upper and lower semiconductor chips 10 may be bonded by adhesive or the like. Anisotropic conductive adhesive (ACA), anisotropic conductive film (ACF) or anisotropic conductive paste (ACP) may be used as the adhesive. The anisotropic conductive adhesive is what conductive particles (filler) is dispersed in binder and dispersant is doped in some cases. The electrical connection of the bump 22 (the first electrical connecting section) and the exposed part of the conductive layer 18 (the second electrical connecting section) may be made by the conductive particles. Thermo-hardening adhesive is often used as the binder of the anisotropic conductive adhesive.

FIG. 4C shows a stacked-type of semiconductor device in which a plurality of semiconductor devices are stacked in accordance with the present invention. In the stacked-type of semiconductor device, the terminal such as the bump 22 (the first electrical connecting section) enters from the surface (second surface) of the semiconductor chip 10 when the plurality of semiconductor devices are stacked. Accordingly, the stacked-type of semiconductor device may be miniaturized and thinned.

Figure 5:
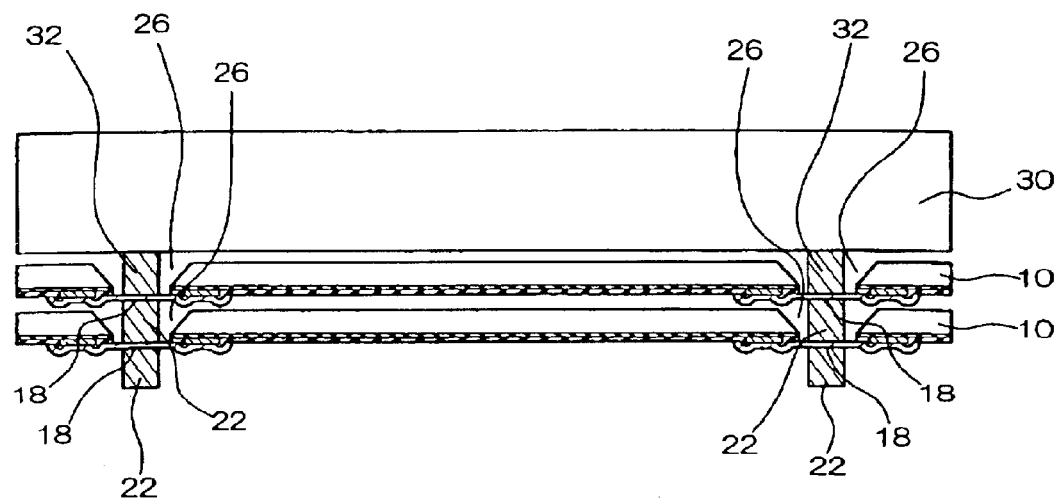
FIG. 5 shows the semiconductor device provided according to the first embodiment of the present invention.

FIG. 5 shows the semiconductor device in which a semiconductor chip 30 is stacked. More specifically, the semiconductor chip 30 is bonded to the semiconductor chip 10 which is located at the outermost side where the hole 26 is formed among the plurality of stacked semiconductor chips 10. The semiconductor chip 30 may be a bare chip (flip chip) or may be what some packaging has been implemented beside those to which the present invention is applied. The semiconductor chip 30 has a plurality of bumps 32 and each bump 32 is junctioned to the conductive layer 18 via the hole 26 of the semiconductor chip 10.

Second Embodiment

FIGS. 6A through 8C show a semiconductor device of a second embodiment.

A semiconductor chip 110 used in the present embodiment has a plurality of electrodes 114. Differing from the ring-shaped electrode 14 described in the first embodiment, each electrode 114 does not necessarily require a center hole and its shape in a plan view may be rectangular, circular or other shape. The plurality of electrodes 114 may be formed at the center or the edge of one surface of the semiconductor chip 110. When the semiconductor chip 110 is rectangular, the electrodes 114 may be formed along four sides or parallel two sides. An insulating film 112 and a passivation film 116 are formed on the semiconductor chip 110 as described in detail in the first embodiment.

Manufacturing Method of Semiconductor Device

A semiconductor device will be manufacturing by the following method by using the semiconductor chip 110 in the present embodiment. The following method is applicable to the first and second embodiments.

Figure 6A:
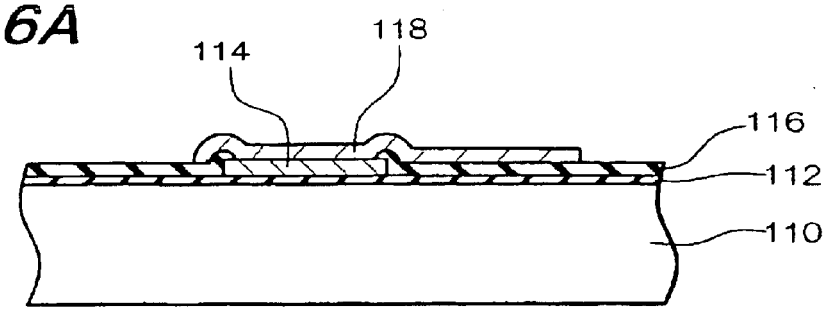
FIGS. 6A to 6C show a method of manufacturing a semiconductor device according to a second embodiment of the present invention.

As shown in FIG. 6A, the conductive layer 118 is formed above and the neighboring area of the electrode 114 (on the passivation film 116 in the case shown in FIG. 6A). The conductive layer 118 is formed to have a size which enables good electrical connection with the electrode 114 on the electrode 114 and to have a size which enables to form the bump 122 and which is greater than a hole 126 on the neighboring area of the electrode 114. The description for the conductive layer 18 in the first embodiment may be applied to the structure of and method of forming the conductive layer 118 and others.

Figure 6B:
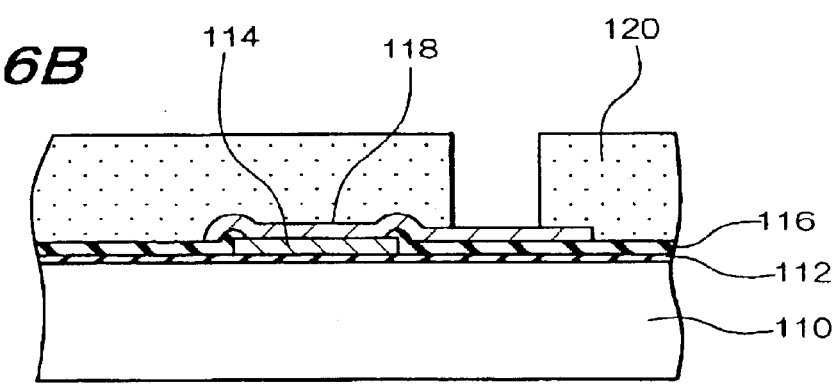

A resist 120 is formed and patterned on the surface of the semiconductor chip 110 on which the electrode 114 is formed as shown in FIG. 6B. The description for the resist 20 in the first embodiment may be also applied to its detail. It is noted that an opening is formed at the position on the conductive layer 118 by avoiding the electrode 114.

Figure 6C:
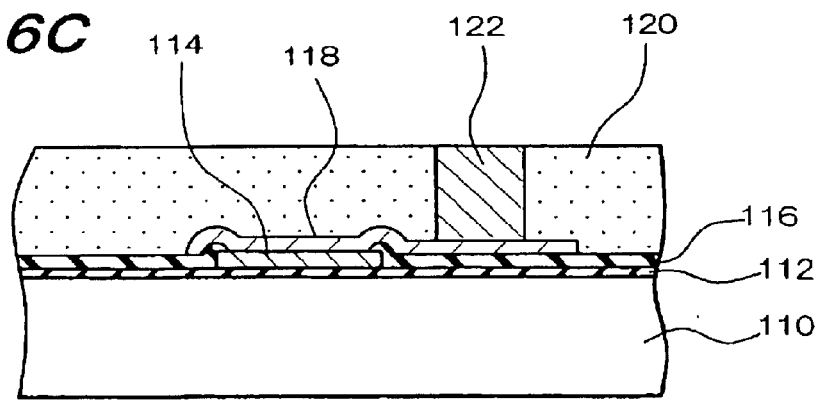
Figure 7A:
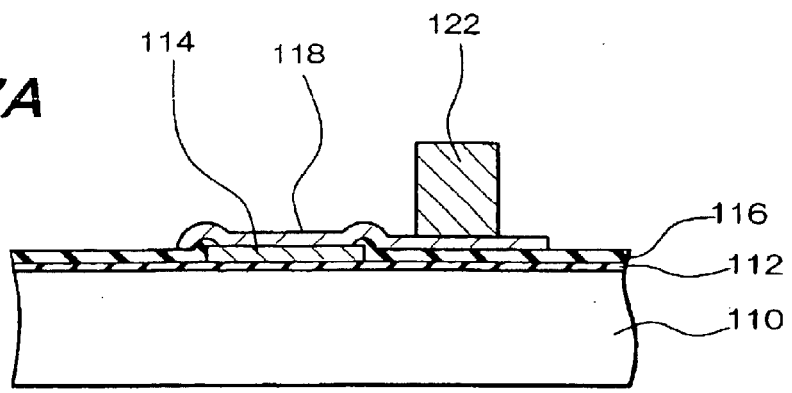
FIGS. 7A to 7C show the method of manufacturing a semiconductor device according to the second embodiment of the present invention.

The bump 122 (the first electrical connecting section) is formed by forming a metallic layer by means of electroless plating in the opening of the resist 120 as shown in FIG. 6C. Then, the resist 120 is removed as shown in FIG. 7A. The description for the bump 22 in the first embodiment may be also applied to the structure and method of forming the bump 122. It is noted that the bump 122 is formed at the position on the conductive layer 118 by avoiding the electrode 114.

Figure 7B:
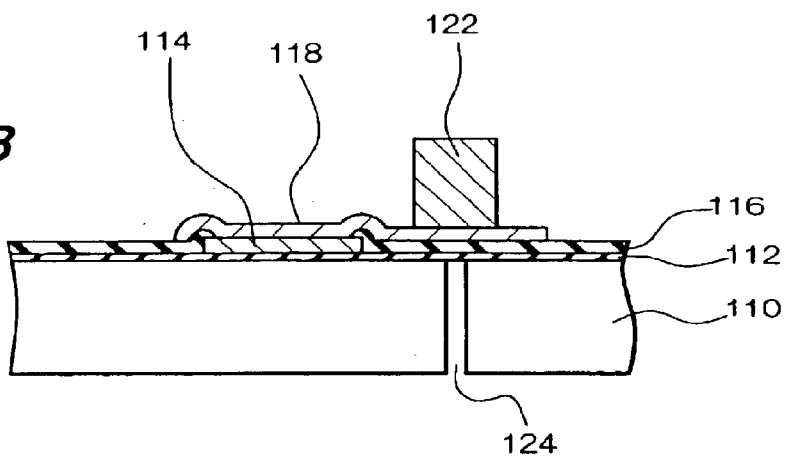

A small hole 124 is then formed in the semiconductor chip 110 as shown in FIG. 7B. The description for the small hole 24 in the first embodiment may be also applied to the small hole 124. It is noted that the small hole 124 is formed under the bump 122.

Figure 7C:
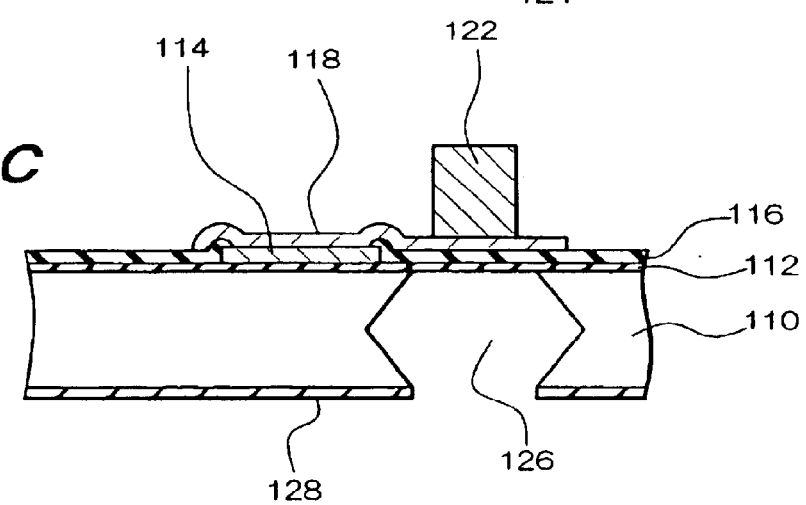

Next, a hole 126 is formed in the semiconductor chip 110 as shown in FIG. 7C. The hole 126 is formed by enlarging the small hole 124 described above. The shape and method of forming the hole 26 described in the first embodiment may be applied to the hole 126. A film 128 which is not etched is formed in advance to stop the enlargement of the opening of the hole 126.

Figure 8A:
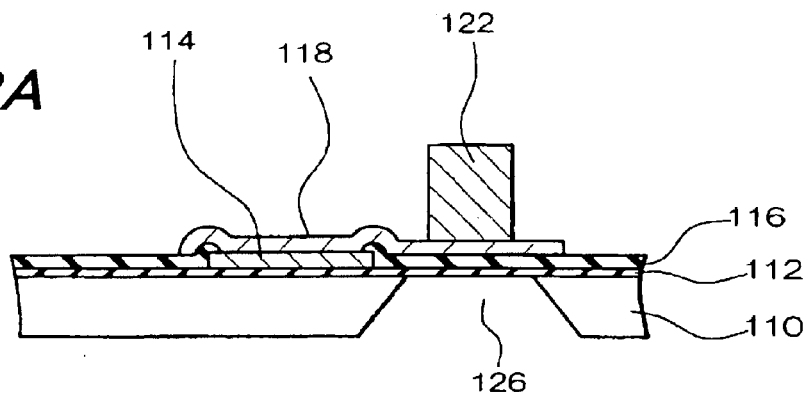
FIGS. 8A to 8C show the method of manufacturing a semiconductor device according to the second embodiment of the present invention.
Figure 8B:
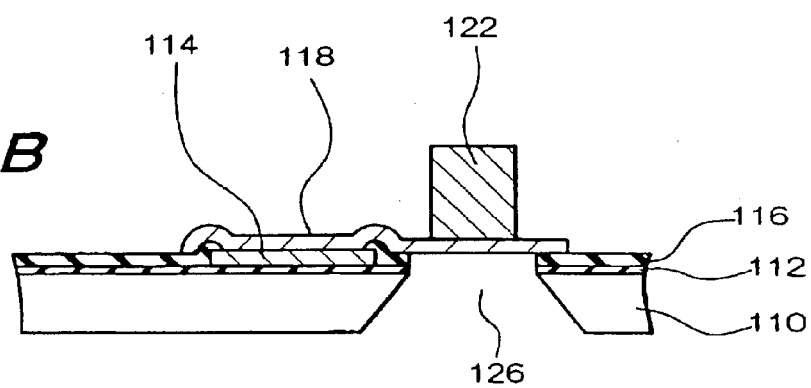

Then, the semiconductor chip 110 is ground as shown in FIG. 8A to expose the conductive layer 118 at the inside of the hole 126 as shown in FIG. 8B. The description in the first embodiment may be also applied to these methods. Thus, the exposed part of the conductive layer 118 through the hole 126 becomes the second electrical connecting section. The second electrical connecting section is formed at the position dented from the second surface (the surface opposite from the electrode 114). Because the shape of the electrode 114 is not limited in the present embodiment, semiconductor chips used in general may be used. The other effects are the same with those in the first embodiment.

Semiconductor Device

Figure 8C:
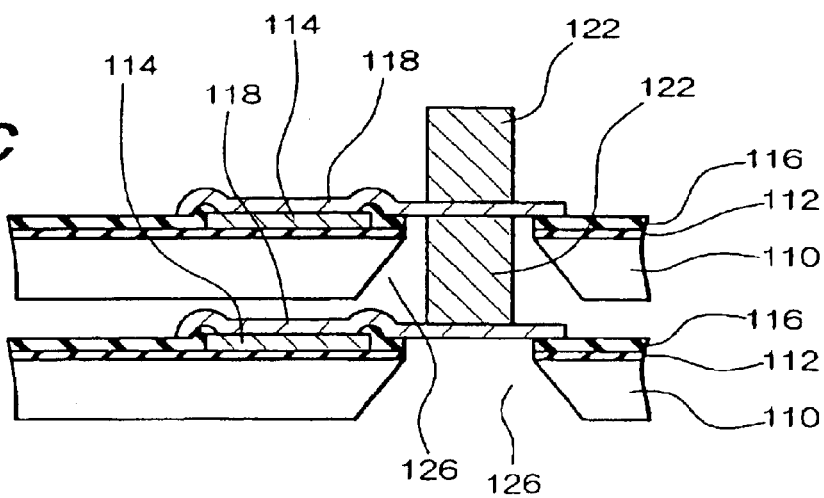

FIG. 8B shows a semiconductor device to which the invention is applied. In the semiconductor device of the present embodiment, the bump 122 is formed at the position adjacent to the electrode 114, i.e., the position avoiding the electrode 114. According to the present embodiment, the second electrical connecting section (the exposed part of the conductive layer 118) is formed at the dented position. Accordingly, when the plurality of semiconductor chips 110 are stacked as shown in FIG. 8C, the terminal such as the bump 122 (the first electrical connecting section) enters from the surface of the semiconductor chip 110. Thus, the three-dimensionally mounted semiconductor devices (stacked-type of semiconductor device) may be miniaturized and thinned. It is noted that the electrical structure and the means for adhering the semiconductor chips are the same with those described in the first embodiment.

Third Embodiment

FIGS. 9A through 12B show a semiconductor device of a third embodiment to which the invention is applied. The semiconductor chip 110 described in the second embodiment will be used in the present embodiment.

Manufacturing Method of Semiconductor Device

Figure 9A:
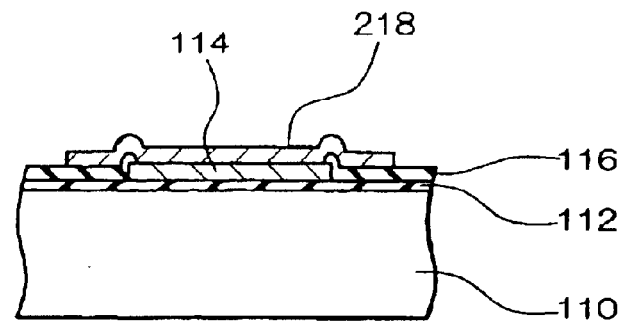
FIGS. 9A to 9C show a method of manufacturing a semiconductor device according to a third embodiment of the present invention.

A conductive layer 218 is formed on the electrode 114 as shown in FIG. 9A. It is preferable to form the conductive layer 218 so that it covers the surface of the electrode 114. For example, when the edge of the electrode 114 is covered by the passivation film 116, the conductive layer 218 is formed at least at the part exposed from the passivation film 116. It is noted that the conductive layer 218 may be formed so as to extrude from the electrode 114. The description for the conductive layer 18 in the first embodiment may be applied to the structure of and method of forming the conductive layer 218 and others.

Figure 9B:
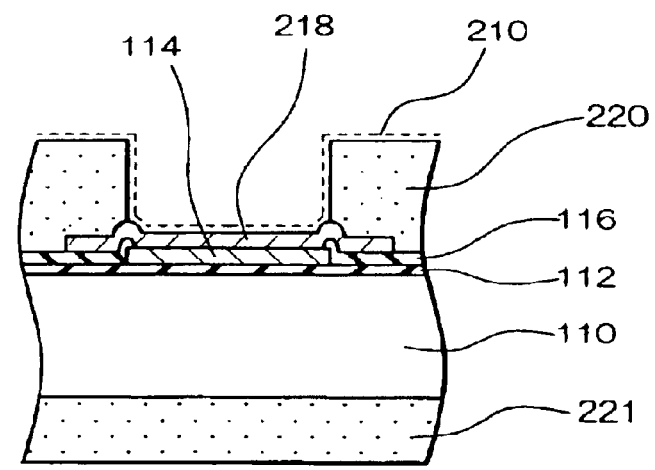

Then, a resist 220 is formed and patterned on the surface of the semiconductor chip 110 on which the electrode 114 is formed as shown in FIG. 9B. The description for the resist 20 in the first embodiment may be also applied to its detail. The resist 220 has an opening on the conductive layer 218 and the electrode 114. A resist 221 may be also formed at the surface opposite from the surface of the semiconductor chip 110 on which the electrode 114 is formed. This is also applicable to the first and second embodiments.

Then, a catalyst 210 is provided on the resist 220 and the conductive layer 218 as shown in FIG. 9B. The catalyst 210 is palladium in the present embodiment. The catalyst 210 may be formed by providing only palladium on the resist 220 and the conductive layer 218 by soaking the semiconductor chip 110 in a mixed solution of palladium and tin and by processing by acid such as hydrochloric acid thereafter.

Then, the catalyst 210 may be provided only at the area where a bump 222 (see FIG. 9C) is to be formed by peeling off the resist 220. The resist 220 may be peeled off by irradiating ultraviolet rays or by soaking into a solution of weak alkaline. Thereby, the resist 220 may be peeled off readily and reliably. It is noted that the resist 221 formed on the opposite side may be also peeled off in the same time in peeling off the resist 220.

Figure 9C:
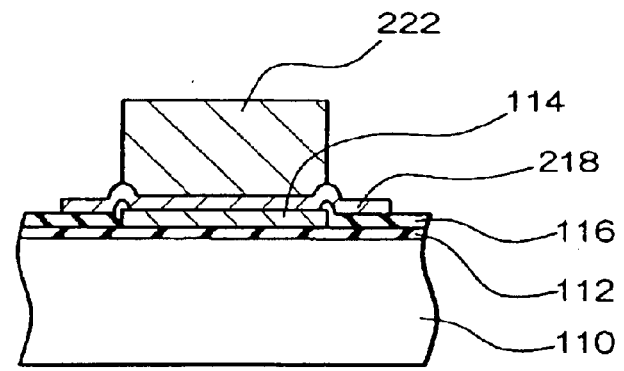

Then, the bump 222 is formed by conducting electroless plating as shown in FIG. 9C. When the bump 222 is to be made of nickel, the semiconductor chip 110 is soaked into nickel plating solution and nickel is deposited by reducing nickel ions within the solution by using palladium, i.e., the catalyst 210, as the nucleus. Or, the bump 222 may be made from copper and gold. A plurality of different metals (e.g., Ni+Cu and Ni+Au+Cu) may be used as the conductive materials for forming the bump 222. The bump 222 may be formed of plural layers of them.

The catalyst 210 is provided after patterning the resist 220 and then the resist 220 is peeled off to expose the catalyst 210 on the area where the bump 222 is formed in the case described above. Differing from this case, the catalyst 210 may be exposed in the area where 222 is formed as a result by providing the resist 220 by patterning except of the area where the bump 222 is formed after providing the catalyst 210 on the whole surface of the semiconductor chip 110. In this case, the resist 220 is peeled off after forming the bump 222.

Figure 10A:
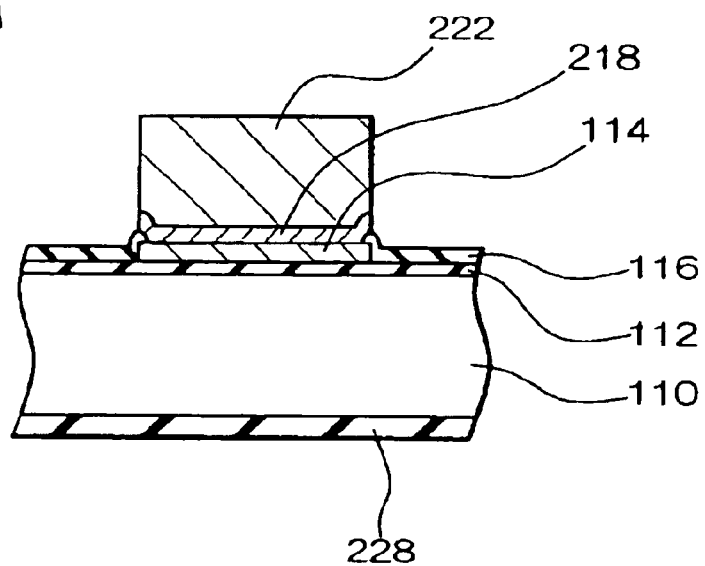
FIGS. 10A to 10B show the method of manufacturing a semiconductor device according to the third embodiment of the present invention.

Next, the conductive layer 218 is etched by using the bump 222 as a mask or by providing a protecting film not shown in the 222 as necessary as shown in FIG. 10A. The conductive layer 218 thus obtained has a shape which does not extrude out of the bump 222, i.e., only under the bump 222. A film 228 which is not wet-etched as described later is formed in advance on the surface of the semiconductor chip 110 opposite from the electrode 114 as shown in FIG. 10A. This film 228 is made from silicon oxide film or the like and may be formed by means of CVD.

Figure 10B:
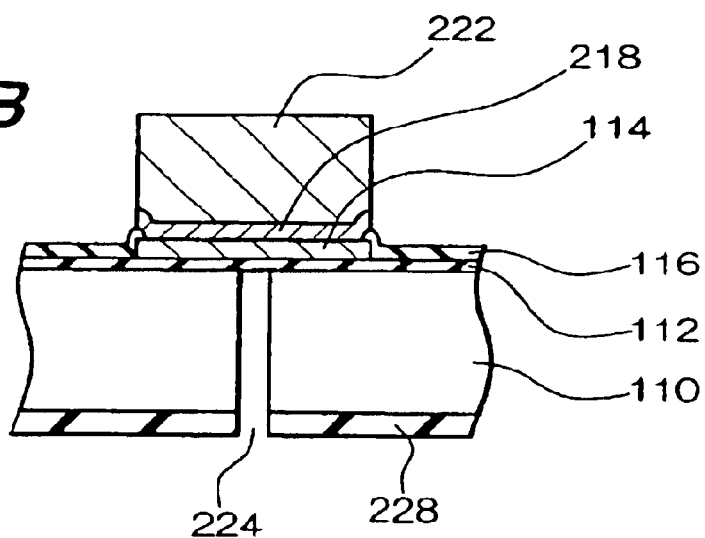
Figure 11A:
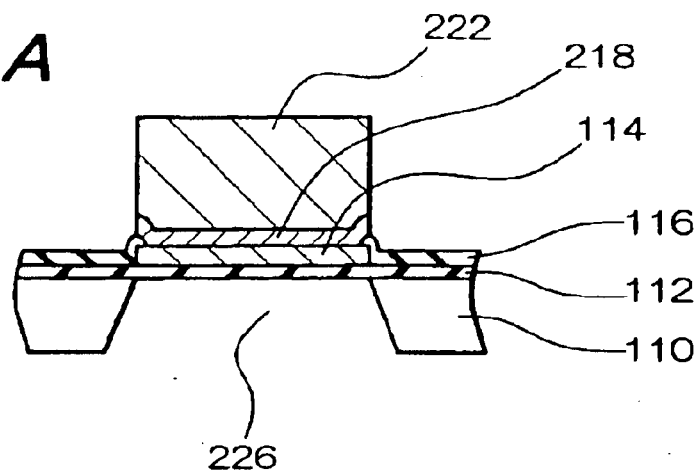
FIGS. 11A to 11C show the method of manufacturing a semiconductor device according to the third embodiment of the present invention.

The bump 224 is formed by laser or the like as shown in FIG. 10B and then the back of the semiconductor chip 110 (the surface opposite from the electrode 114) is ground by carrying out wet-etching as described in the first embodiment. Thus, the hole 226 is formed in the semiconductor chip 110 as shown in FIG. 11A. The description for the hole 26 in the first embodiment is applicable to the shape of the hole 226.

Figure 11B:
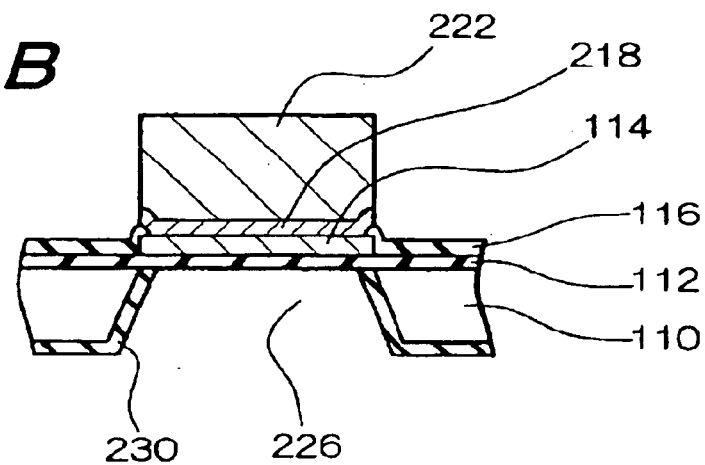
Figure 11C:
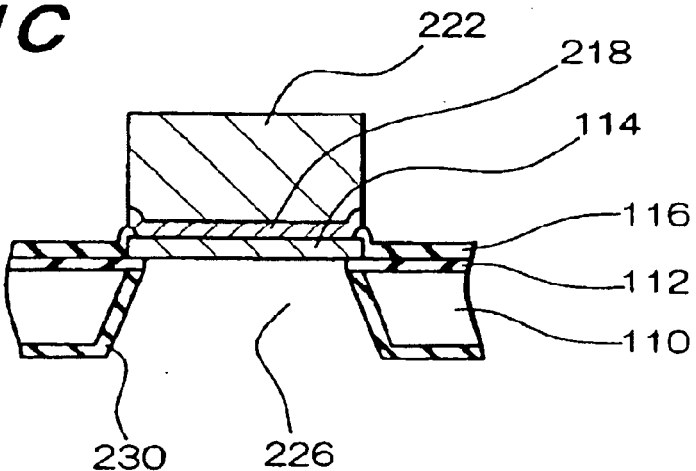

An insulating film 228 is formed at the inner surface of at least the hole 226 as shown in FIG. 11B. Then, the insulating film 112 formed under the electrode 114 is etched through the hole 226 to expose the electrode 114 through the hole 226.

Figure 12A:
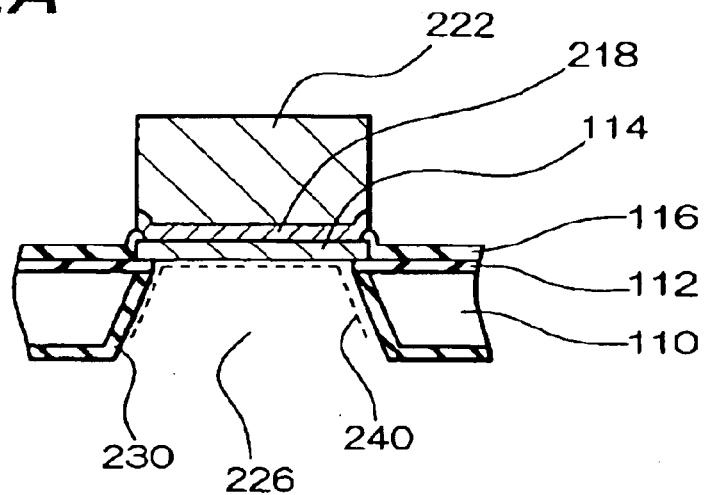
FIGS. 12A and 12B show the method of manufacturing a semiconductor device according to the third embodiment of the present invention.

Then, a catalyst 240 is provided at least at the inside of the hole 226 and the area including the surface where the electrode 114 is exposed, as shown in FIG. 12A. The description for the catalyst 210 and the method of providing it shown in FIG. 9B are applicable to the catalyst 240. It is noted that a dry film may be used instead of liquid resist when the hole 226 is formed and a difference of step is large.

Figure 12B:
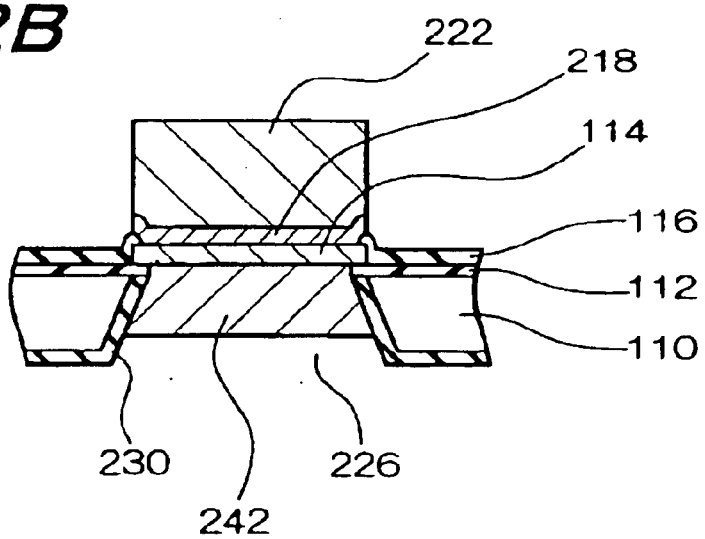
Figure 13:
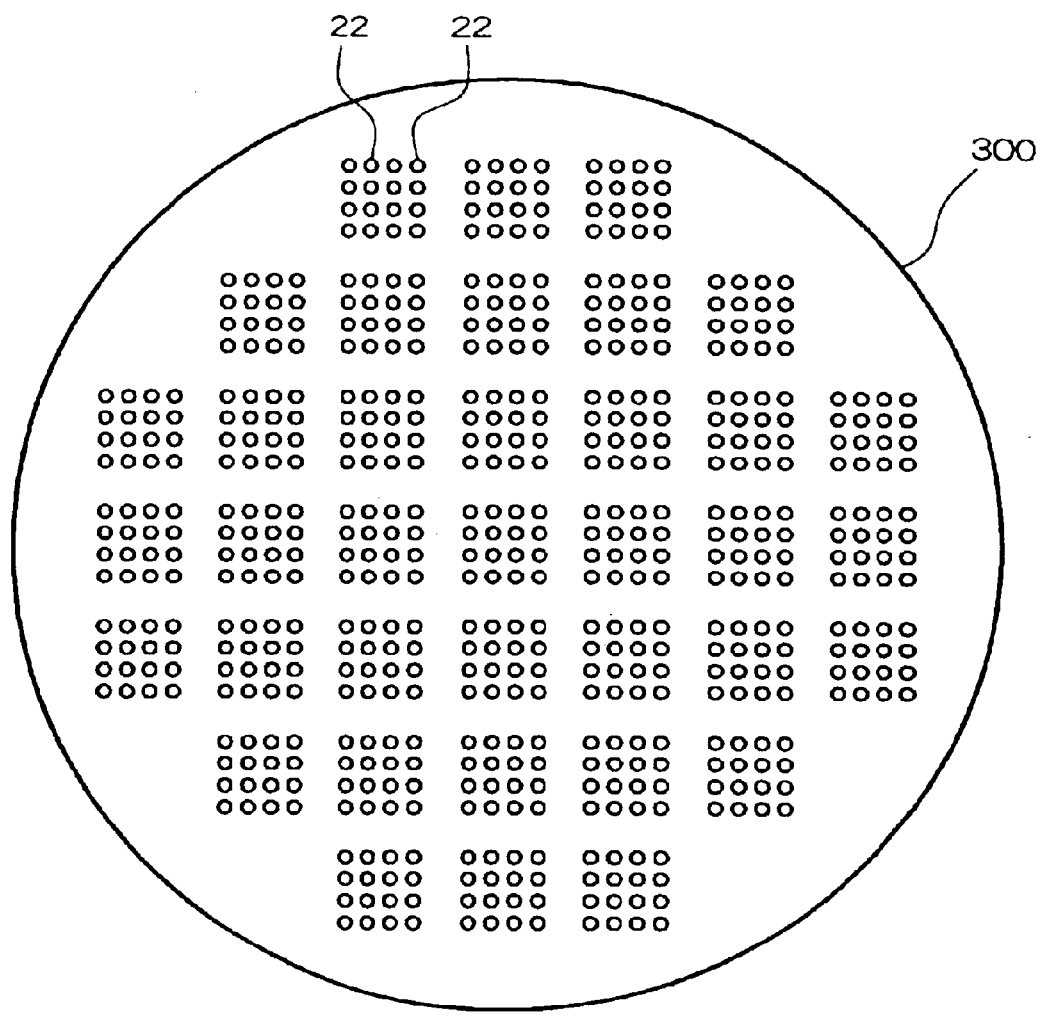
FIG. 13 shows a method of manufacturing a semiconductor device according to another embodiment of the present invention.

Then, a conductive layer 242 is formed at the back of the electrode 114 (exposed surface) via the hole 226 as shown in FIG. 12B. The small hole 242 is formed at the position dented from the surface (or may be the surface of the insulating film 230) opposite from the surface of the semiconductor chip 110 on which the bump 222 is formed as shown in FIG. 12B. The conductive layer 242 is formed of brazing materials such as metal conductive paste and solder is formed often by means of plating, printing and dispenser. The conductive layer 242 may be junctioned with the bump 22 as an electrical and mechanical junctioning member.

According to the present embodiment, the second electrical connecting section (the conductive layer 242) is crated at the dented position. Then, when a plurality of semiconductor devices are stacked, the terminal such as the bump 222 (the first electrical connecting section) enters from the surface of the semiconductor chip 110. Thus, the three-dimensionally mounted semiconductor devices (stacked-type of semiconductor device) may be miniaturized and thinned. It is noted that the electrical structure and the semiconductor chip adhering means are the same as those described in the first embodiment.

Other Embodiments

Although the above-mentioned processes have been carried out on the semiconductor chip 10, they may be carried out on a semiconductor wafer. For example, the above-mentioned processes may be carried out to a semiconductor wafer 300 to form the first electrical connecting section (the bump 22) and the second electrical connecting section (the exposed part of the conductive layer 18). The semiconductor devices may be obtained by dicing the semiconductor wafer.

Figure 14:
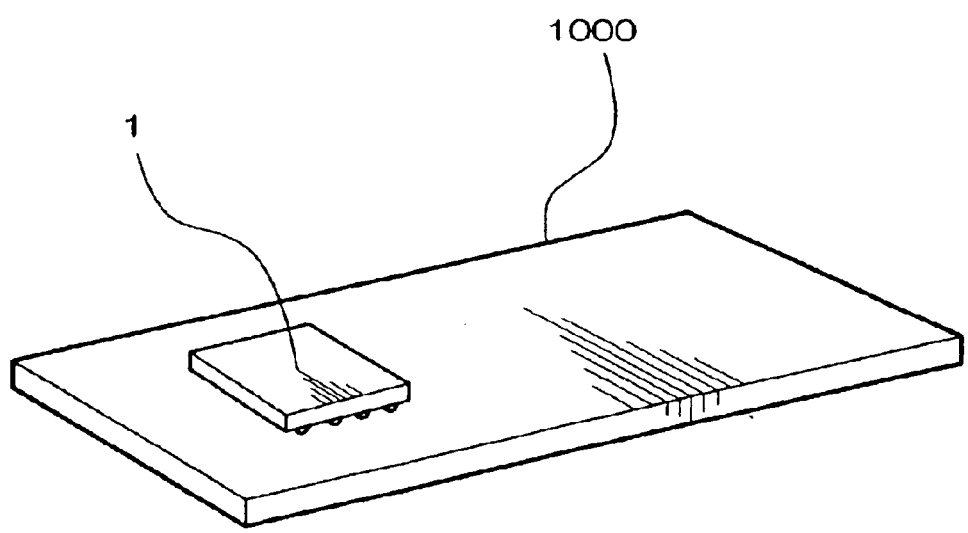
FIG. 14 shows a circuit board to which the semiconductor device according to the embodiment of the present invention is mounted.

FIG. 14 shows a circuit board 1000 on which the semiconductor device 1 of the present embodiment is mounted. An organic substrate such as glass epoxy substrate is used in general for the circuit board 1000. Wiring patterns made of copper for example are formed as a desirable circuit in the circuit board 1000 and their electrical conductivity is attained by mechanically connecting those wiring patterns with the connecting section, e.g., the bump 22 which is the first electrical connecting section, of the semiconductor device 1.

Figure 15:
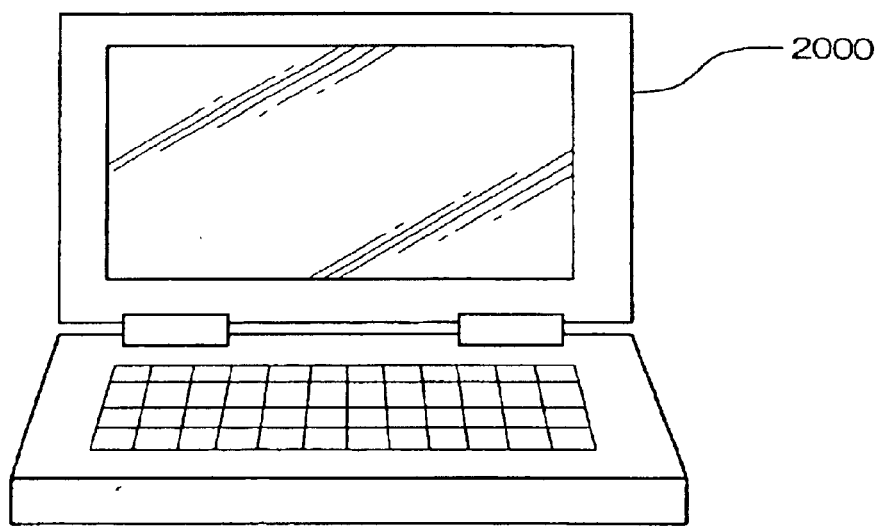
FIG. 15 shows an electronic instrument having the semiconductor device according to the embodiment of the present invention.
Figure 16:
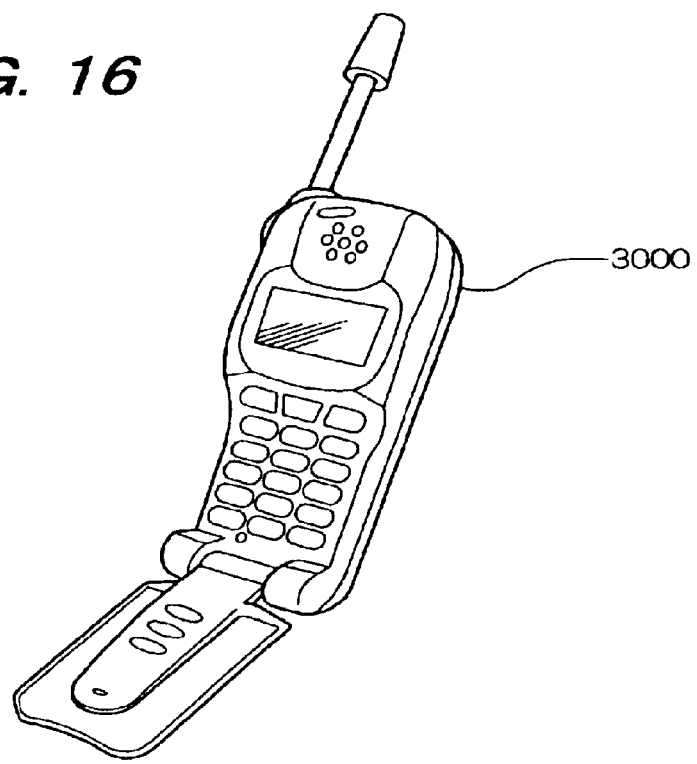
FIG. 16 shows an electronic instrument having the semiconductor device according to the embodiment of the present invention.

Then, FIG. 15 shows a note type personal computer 2000 and FIG. 16 shows a portable telephone set 3000 as electronic instruments having the semiconductor device 1 to which the invention is applied.

It is noted that the electronic parts may be manufactured by replacing the "semiconductor chip" in the embodiments described above with "electronic instrument". Electronic parts manufactured by using such electronic instrument include optical elements, resistors, capacitors, coils, oscillators, filters, temperature sensors, thermisters, varistors, volumes and fuses.

What is claimed is:

1. A method of manufacturing a semiconductor device, comprising the steps of:
    forming a conductive layer on a surface of a semiconductor element on which is provided an electrode and electrically connecting the conductive layer to the electrode;
    forming a first electrical connecting section on the conductive layer and not above the electrode; and
    forming a hole in the semiconductor element so that part of a surface of the conductive layer on the side of the semiconductor element is exposed as a second electrical connecting section.

* * * * *